United States Patent [19]

Patrick et al.

[11] Patent Number: 5,474,648

[45] Date of Patent: Dec. 12, 1995

[54] UNIFORM AND REPEATABLE PLASMA PROCESSING

[75] Inventors: Roger Patrick, Santa Clara, Calif.; Frank A. Bose, Wettingen, Switzerland; Philippe Schoenborn, San Jose, Calif.

[73] Assignee: LSI Logic Corporation, Milpitas, Calif.

[21] Appl. No.: 283,296

[22] Filed: Jul. 29, 1994

[51] Int. Cl.$^6$ .......................... H01L 21/306; B44C 1/22
[52] U.S. Cl. .................. 156/627.1; 156/345; 156/643.1; 216/61; 216/67
[58] Field of Search .................. 156/345, 626.1, 156/627.1, 643.1, 657.1, 662.1; 204/192.33, 298.32; 324/126, 127; 216/61, 67, 79

[56] References Cited

U.S. PATENT DOCUMENTS

| | | | |
|---|---|---|---|
| 4,602,981 | 7/1986 | Chen et al. | 156/627 |
| 4,954,212 | 9/1990 | Gabriel et al. | 156/627 |
| 5,401,350 | 3/1995 | Patrick et al. | 156/345 |
| 5,407,524 | 4/1995 | Patrick et al. | 156/627 |

*Primary Examiner*—William Powell

[57] ABSTRACT

Dynamic control and delivery of radio frequency power in plasma process systems is utilized to enhance the repeatability and uniformity of the process plasma. Power, voltage, current, phase, impedance, harmonic content and direct current bias of the radio frequency energy being delivered to the plasma chamber may be monitored at the plasma chamber and used to control or characterize the plasma load. Dynamic pro-active control of the characteristics of the radio frequency power to the plasma chamber electrode during the formation of the plasma enhances the uniformity of the plasma for more exact and controllable processing of the work pieces.

30 Claims, 8 Drawing Sheets

UNIFORM AND REPEATABLE PLASMA PROCESSING

BACKGROUND OF THE INVENTION

This application is related to commonly owned patent applications: U.S. Ser. No. 08/236,444, entitled "Power Control and Delivery in Plasma Processing Equipment" by Roger Patrick and Frank Bose, filed May 2, 1994; U.S. Ser. No. 08/106,017, now U.S. Pat. No. 5,407,524, entitled "End-Point Detection in Plasma Etching by Monitoring Radio Frequency Matching Network" by Roger Patrick and Frank Bose, filed Aug. 13, 1993; and U.S. Ser. No. 08/027,995, now U.S. Pat. No. 5,401,350, entitled "Coil Configurations for Improved Uniformity in Inductively Coupled Plasma Systems" by Roger Patrick, Frank Bose, Philippe Schoenborn and Harry Toda, filed Mar. 8, 1993; all of the aforementioned applications assigned to LSI Logic Corporation.

1. Field of the Invention

The present invention relates to plasma processing systems and, more particularly, to a method and apparatus for dynamically controlling the delivery of radio frequency power in plasma process systems.

2. Description of the Related Technology

Ionized gas or "plasma" may be used during processing and fabrication of semiconductor devices, flat panel displays and in other industries requiring etching or deposition of materials. Plasma may be used to etch or remove material from semiconductor integrated circuit wafers, sputter or deposit material onto a semiconducting, conducting or insulating surface. Creating a plasma for use in manufacturing or fabrication processes, typically, is done by introducing a low pressure process gas into a process vessel chamber surrounding a work piece such as an integrated circuit wafer. The molecules of the low pressure gas in the chamber are ionized into a plasma by the radio frequency energy (power) source after entering the chamber, and the highly reactive plasma flows over the work piece. The process vessel is used to maintain the low pressures required for the plasma and to serve as a structure for attachment of one or more radio frequency energy sources.

Plasma may be created from a low pressure process gas by inducing an electron flow which ionizes individual gas molecules by the transfer of kinetic energy through individual electron-gas molecule collisions. Typically, electrons are accelerated in an electric field such as one produced by radio frequency ("RF") energy. This RF energy may be low frequencies (below 550 KHz), high frequencies (13.56 MHz), or microwaves (2.45 GHz). A plasma etching system consists of a radio frequency energy source and a pair of electrodes. A plasma is generated between the electrodes while the work piece, such as a semiconductor wafer, is planar with one of the electrodes. The chemical species in the plasma are determined by the source gas(es) used.

Plasma etching methods and apparatus are generally illustrated in U.S. Pat. Nos. Re 30,505 and 4,383,885. These patents illustrate plasma etching systems. A method and apparatus for obtaining a substantially parallel (planar) plasma for processing of integrated circuit wafers is described in U.S. Pat. No. 4,948,458. A typical plasma etching system may consist of an enclosure having an interior bounded at least in part by a radio frequency transparent window. A planar coil is disposed proximate to the window, and a radio frequency energy source is coupled through an impedance matching circuit to the coil. The planar coil radiates the radio frequency energy such that a planar magnetic field is induced in the interior of the enclosure. A plasma is generated thereby from the process gas. This plasma reacts with the surface of the semiconductor wafer, etching it away.

Plasma may also be used in chemical vapor deposition (CVD) to form thin films of metals, semiconductor or insulator materials onto a work piece such as a semiconductor wafer. Plasma-enhanced CVD uses the plasma to supply the required reaction energy for deposition of the desired materials. Typically, radio frequency energy is used to produce this plasma.

Control and delivery of the power in a plasma discharge is of fundamental importance in plasma processing, including etching, sputtering and deposition systems. Uniformity and repeatability are critical aspects of plasma etching. Uniformity of the plasma is required in order to uniformly remove a desired layer from a semiconductor wafer while minimizing the undesired etching of an underlaying layer. Repeatability of the plasma etching process allows for increased manufacturing yields and a wider latitude in the manufacturing process tolerances.

The most commonly used method of obtaining a predetermined radio frequency power is to use a matching network between a radio frequency power source and the plasma discharge chamber electrode or coupling coil. The matching network transforms the impedance (capacitive reactance) of the plasma discharge into a substantially resistive load for the radio frequency power source. The power source is then set to a predetermined power level dependent upon the process parameters desired.

In present plasma systems, radio frequency power is monitored and controlled at the generator output on the assumption that the power losses in the matching network are negligible. However, radio frequency power delivered to the plasma chamber has been found to be substantially less than the generator power because of losses in the matching network and other associated components of the radio frequency power generation system. The amount of actual power in the plasma chamber greatly affects the process conditions. Significant variance in actual power delivered to the plasma chamber may unexpectedly change the anticipated contribution of other process variable parameters, such as pressure and etch rate.

For better control of the plasma process and a more reliable and repeatable deterministic insight into the actual physical effects of process parameter changes, it is preferable to control the characteristics of the radio frequency power actually delivered to the process chamber. A system and method for determining and controlling the radio frequency power parameters being delivered to the plasma chamber is more fully described in co-pending and commonly owned patent application, U.S. Ser. No. 08/236,444, entitled "Power Control and Delivery in Plasma Processing Equipment" by Roger Patrick and Frank Bose, filed May 2, 1994, and incorporated herein by reference.

Plasma processes are characterized and ultimately optimized by evaluating the process results on a work piece such as, for example, a semiconductor wafer. The process results may be characterized as a function of the plasma process parameters, e.g., radio frequency power, plasma gas pressure, plasma chamber electrode spacing, types of gases uses to form the plasma, and the gas flow rates. Use of Response Surface Modeling (RSM) may be employed not only to find the optimum process performance but also to find the most stable plasma etching regions in order to reduce noise errors in the process.

Referring to FIG. 1, the variation in etch rate over time for a plurality of semiconductor device wafers is graphically illustrated. In the graph of FIG. 1, the dots on the horizontal axis represent the plurality of wafers being etched and the vertical axis represents the respective etch rate for each of the plurality of wafers. A significant spread in the etch rate of the wafers can be noted.

Even with the most careful process optimization procedures this etch rate spread is significant because present art plasma etching tools such as the LAM TCP 9400 manufactured by Lam Research Corporation, Fremont, Calif., utilizes static control of the power to the plasma chamber. However, the plasma etching process is a dynamic process, where most of the dynamics are in the first few seconds of the gas discharge, when the plasma stabilizes.

Improved control of the radio frequency power at the plasma chamber will help reduce the range of the etch rate distribution. A system for control of the radio frequency power at the plasma chamber is more fully described in P. Rummel, "Monitoring and Control of RF Parameters Near Plasma Loads," Industrial Heating, May 1991. In addition, the aforementioned patent application, U.S. Ser. No. 08/236,444, entitled "Power Control and Delivery in Plasma Processing Equipment" more fully illustrates power control and delivery at the plasma chamber.

Measuring and controlling the radio frequency power at the plasma chamber electrodes, however, does not eliminate all of the non-uniformities and the wide variance (spread) in the etch rates between semiconductor wafers sequentially processed in the plasma chamber. It has been determined that the remaining non-uniformities and the spread in the etch rates are caused substantially by the way the plasma gas discharge is started. The plasma discharge is unstable during the first few seconds of the gas becoming a plasma. The plasma instability during these first few seconds causes more of the etch non-uniformities and spread in the etch rates than does the bulk etch time when the plasma is stable.

FIGS. 3A and 3B illustrate the power taken by the plasma load as a function of time for a plurality of wafers, e.g., W7, W8, W11, W13, W15, W17, W19 and W23 (FIG. 3C). The load power versus time required during the start of the processing for each wafer is different (FIG. 3B is an expanded scale of FIG. 3A). It is this difference that has such a significant effect on the overall uniformity (or lack thereof) of the etch process for each wafer.

What is needed is a way to optimize the plasma process during the first few seconds of creating a plasma from the gas by the application of the radio frequency power. It is therefore an object of the present invention to dynamically optimize the etching process during the formation (start) of the plasma.

SUMMARY OF THE INVENTION

The present invention provides a system and method for dynamically controlling the radio frequency power parameters being delivered to a plasma chamber in order to optimize the formation of the plasma gas with a resulting increase in the repeatability and uniformity of the etching process. The present invention accomplishes this object by monitoring the power of the radio frequency energy being delivered to the plasma chamber, and dynamically controlling the radio frequency energy with a computer system. In addition, the voltage, current, phase and impedance of the plasma chamber electrode may also be measured and the measurement information used by the computer power control system of the present invention.

A control system that monitors and controls the radio frequency power at the plasma chamber electrode is illustrated in FIGS. 2A and 2B. This radio frequency power control system includes a radio frequency sensor placed closely to the plasma load electrodes in the plasma etching chamber. This closely placed sensor provides signals to a power controller which, in turn, controls a radio frequency power generator. By controlling the amount of power at the plasma electrode instead of at the output of the generator, a number of errors, created by the variable process parameters and typically affecting the process accuracy of the radio frequency plasma system, are eliminated. Some of these process variable errors are: a) radio frequency generator forward power sensor accuracy, b) radio frequency generator forward power sensor load dependance, c) transmission line attenuation, d) matching network tuning window, e) and matching network losses (non-linear).

According to an embodiment of the present invention (FIG. 2A), a radio frequency matching network is connected between the output of a radio frequency power generator and a plasma chamber electrode such as, for example, a plate electrode or a planar coil. A radio frequency power sensor adjacent to the chamber electrode accurately measures the actual radio frequency power being delivered to the plasma chamber. The sensor may also measure the voltage, current and phase angle at the chamber electrode, and measure the chamber impedance as desired.

According to another embodiment of the present invention (FIG. 2B), a radio frequency circulator is connected to the output of a radio frequency power generator. The circulator is used to pass the radio frequency power to a plasma chamber electrode such as, for example, a plate electrode or a planar coil. A sensor between the circulator and chamber electrode measures the radio frequency power being delivered to the plasma chamber. In addition, the sensor measures the voltage, current and phase angle at the chamber electrode, and measures the chamber impedance as discussed above.

The power sensor connects to a computer controlled power controller that controls the output power of the radio frequency power generator as described above. The purpose of the circulator is to minimize the amount of reflected power and generated harmonics from the plasma chamber electrode back to the generator. A circulator is a three port device that allows radio frequency power to flow in substantially one direction only. By connecting a terminating resistor to the circulator, the reflected power and generated harmonics from the plasma chamber electrode are absorbed and dissipated in this resistor. This embodiment of the present invention comprises a simple radio frequency power delivery system for use in a plasma generating system without complex mechanical and electrical matching circuits.

The power sensor connects to a computer power controller that uses the sensor information to dynamically and pro-actively control the output power of the radio frequency power generator so that a desired power profile over time is available at the chamber electrode. The computer power controller may be programmed so that a desired process power profile is selectable for each type of process gas and/or work piece. The power profile is selected to obtain optimal plasma characteristics during the etching process.

The power controller of the present invention utilizes a computer system and software to dynamically control the ramp up time, power overshoot, delay times, etc. of the radio frequency power delivered to the plasma chamber electrodes during the first few seconds of the initiation of the plasma process. The computer system may continue to control the radio frequency power during the entire plasma etching process. Etch rate and uniformity of etch may be more closely controlled by dynamically controlling the radio frequency power etch process parameters during formation of the plasma.

As an alternate or addition to utilizing a power sensor at the chamber, dynamic control and optimization could also be implemented by other measurement devices such as, for example, microwave interferometers and optical emission spectrometers. The present invention contemplates controlling other process parameters, in addition to power, such as, for example, plasma gas flow or pressure.

FIGS. 4A and 4B illustrate test results of the etch rates obtained with a static power control system (Lam) and the dynamic computer controlled system (AE) of the present invention. A wide variance (spread) is illustrated in FIGS. 4A and 4B for the static power control system (Lam), while the dynamic control system (AE) of the present invention is significantly more uniform for each wafer. Greatly improved etch rate consistency and uniformity are illustrated in FIGS. 4A and 4B, respectively, when utilizing the system and method of the present invention.

FIGS. 5A and 5B illustrate the dynamic power control of the present invention that improves the etch uniformity. It is understood to those of ordinary skill in the art of plasma etching that the optimized power delivery for different gas chemistries may have significantly different characteristics. Furthermore, it may be advantageous to control one or more of the other electrical parameters of the plasma electrodes such as, for example, the electrode voltage. There are instances when the voltage across the work piece in the plasma chamber can exceed about 350 volts instead of the more typical 110 volts. This excess electrode voltage can severely damage the devices on the work piece semiconductor wafer or corrupt the film on liquid crystal displays. By dynamically controlling the plasma etch parameters, much of the unwanted plasma characteristics may be eliminated.

The computer control system of the present invention may also monitor the plasma chamber electrode load characteristics so that detection of chamber leaks may be determined. A chamber leak occurs when air enters the plasma chamber during the low pressure gas plasma formation or operation. A properly operating plasma chamber will have a well defined electrode load that may be characterized by the radio frequency parameter sensor. If an unwanted leak occurs at least some of the electrode load parameters will change. These unexpected changes may be detected by comparing the process to a process profile and noting any deviation so that an operator may alerted that the plasma process system is not functioning as expected. Contamination of the plasma chamber may also be detected in this manner because any contaminates affect the plasma etching process profile.

An object of the present invention is to dynamically control the radio frequency power in a plasma etching process.

Another object is to dynamically optimize the plasma etching process.

Still another object is to improve the repeatability of the plasma etching process.

A further object is to improve the uniformity of the plasma etching process.

Another object of the present invention is to reduce over etch time, thus reducing damage to the work piece.

Another object is to reduce etch time and improve process through put.

Still another object is to increase the parameter range for a desired process characteristic.

Another object is to reduce plasma etching process fabrication costs by reducing process variations.

Another object is to minimize overshoot of radio frequency induced plasma process parameters so as to reduce damage to the work piece.

An advantage of the present invention is more uniform processing of semiconductor wafers.

Another advantage is preventing excessive voltages from degrading work pieces in the plasma chamber.

Another advantage is starting a plasma with an optimal radio frequency power value so that the resulting plasma characteristics are substantially the same as the characteristics of plasmas in similar plasma processes.

A feature of the present invention is the use of a computer and software program for dynamically controlling the radio frequency power to a plasma chamber electrode.

Another feature is control of the maximum voltage potential on the work piece.

Still another feature is control of the maximum current flow in the work piece.

Other and further objects, features and advantages will be apparent from the following description of presently preferred embodiments of the invention, given for the purpose of disclosure and taken in conjunction with the accompanying drawings.

DESCRIPTION OF PREFERRED EMBODIMENTS

Figure 1:
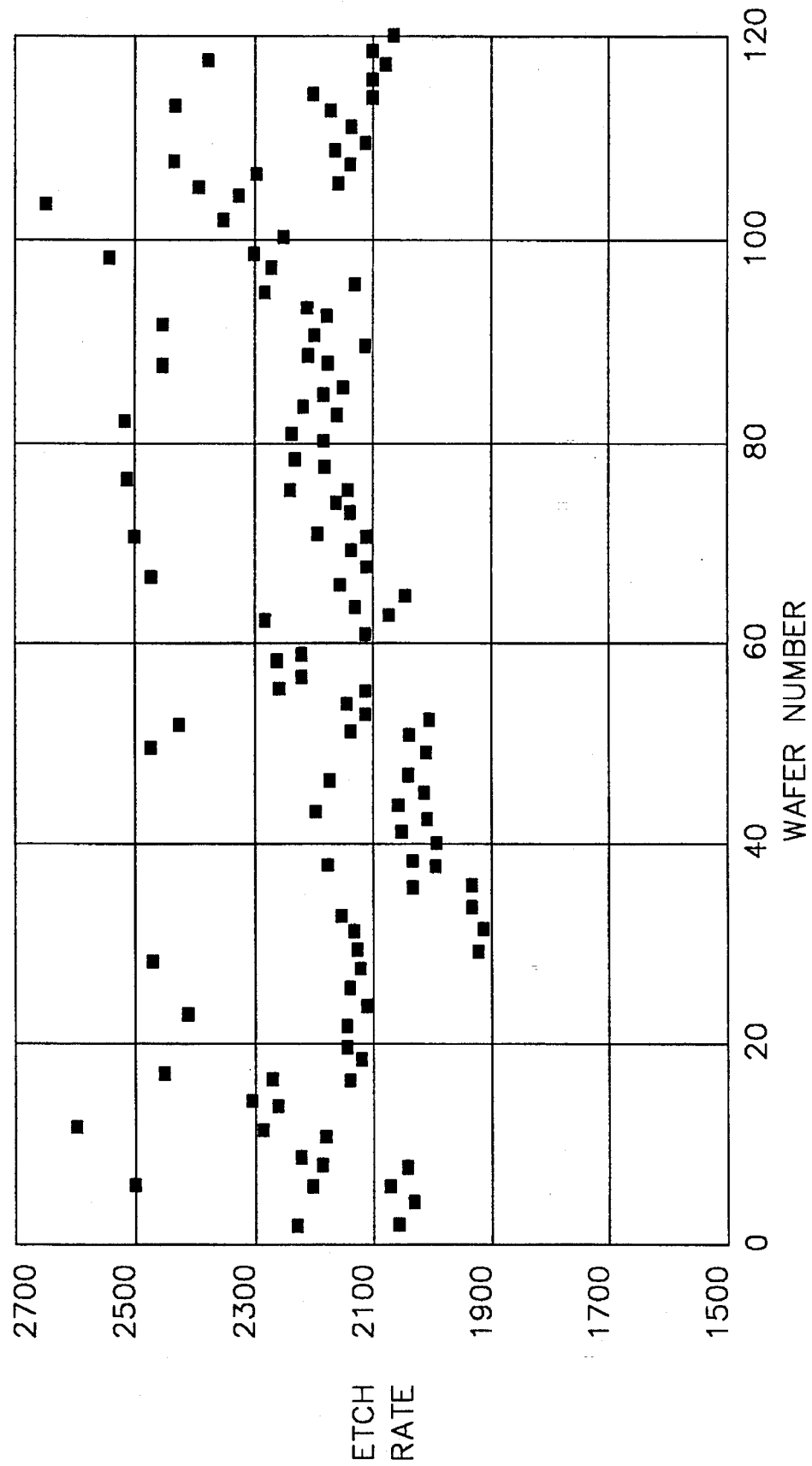
FIG. 1 is a graph of etch rates for a plurality of wafers etched by a prior art etching process.

Referring now to the drawings, the details of preferred embodiments of the present invention are schematically illustrated. Like elements are numbered the same, and similar or related elements are represented by the same number and a different lower case letter suffix.

Figure 2A:
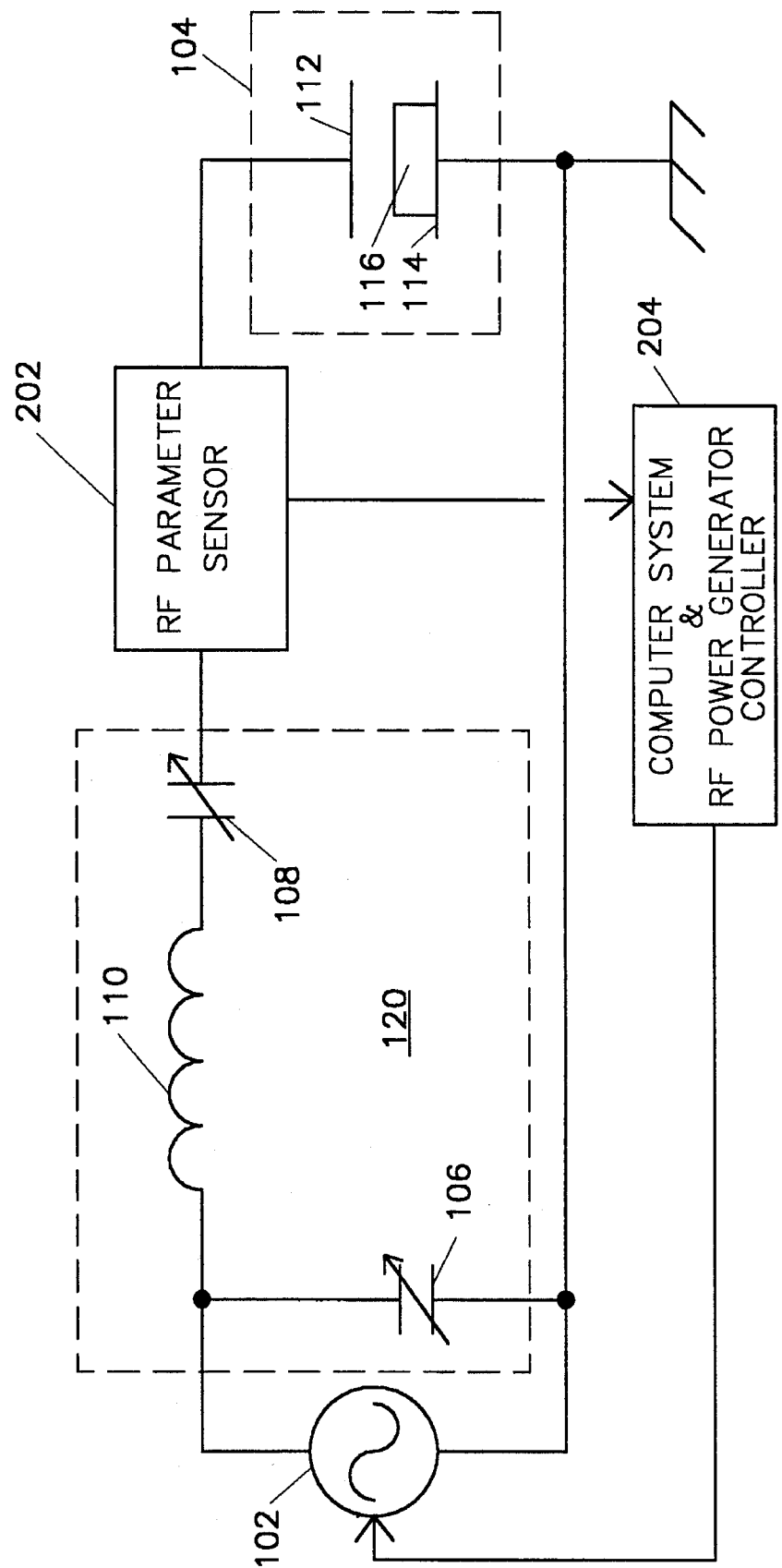
FIGS. 2A and 2B are schematic block diagrams of embodiments of the present invention.

Referring now to FIG. 2A, a system for plasma etching a semiconductor wafer is illustrated schematically. A radio frequency ("RF") generator 102 is coupled to a plasma chamber 104 through a matching network 120 consisting of variable capacitors 106 and 108, and coil 110. The plasma chamber 104 includes electrodes 112 and 114. A semiconductor wafer 116 is in planar communication with the electrode 114. An RF excitation field is created between the electrodes 112 and 114, and when a process gas or gases (not illustrated) is introduced into the plasma chamber 104, the gas turns into a plasma. The plasma reactively etches the surface of the semiconductor wafer 116.

Maximum transfer of RF power from the RF generator 102 to the plasma chamber 104 electrodes 112 and 114 results when the plasma chamber 104 load impedance is matched to the impedance of the RF generator 102. The values of coil 110 and variable capacitors 106 and 108 are selected for an appropriate impedance transformation between the RF generator 102 and the plasma chamber 104 electrodes 112 and 114. Variable capacitors 106 and 108 may be automatically adjusted to obtain a substantially resistive termination for the RF generator 102.

Power sensor 202 measures the radio frequency power being delivered to the plasma chamber 104. A power controller 204 utilizes a signal representative of the measured power from the power sensor 202 to control the amount of power from the RF generator 102. Matching network 120 automatically adjusts to produce a match condition between the RF generator 102 and the plasma chamber 104.

An advantage in measuring and controlling the power at the plasma chamber is that a more uniform and repeatable plasma process results because the widely varying power losses through the matching network 120 are no longer a factor.

Figure 2B:
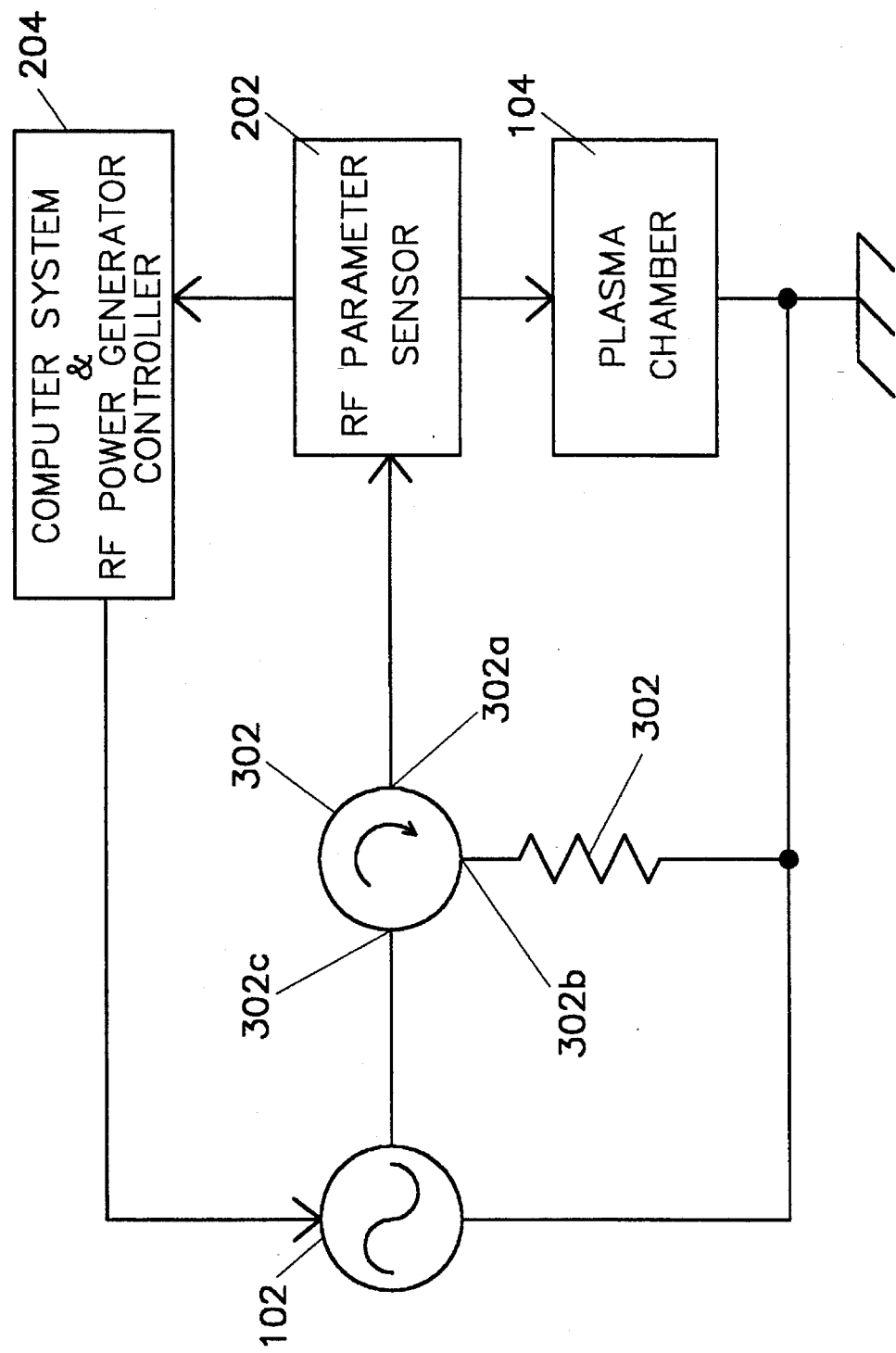
Figure 3A:
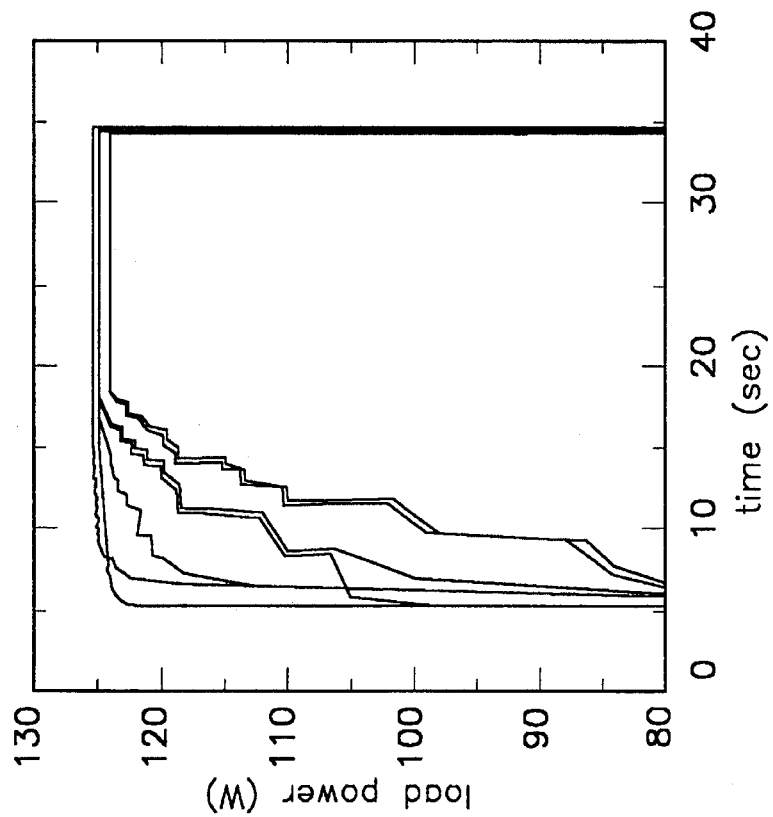
FIGS. 3A and 3B are graphs of the power taken by the different wafers noted in FIG. 3C.
Figure 3B:
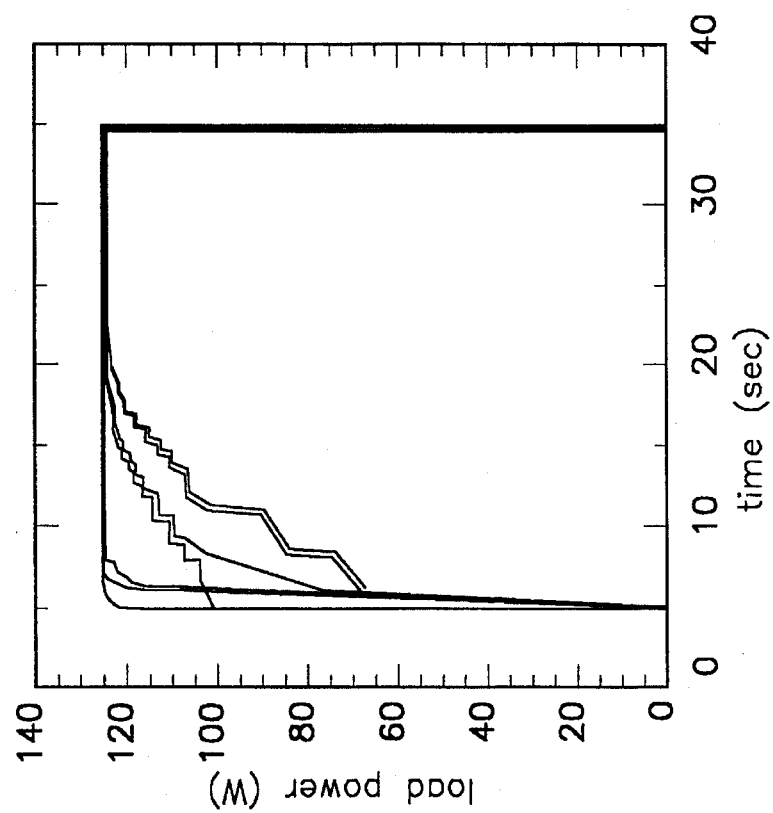
Figure 3C:
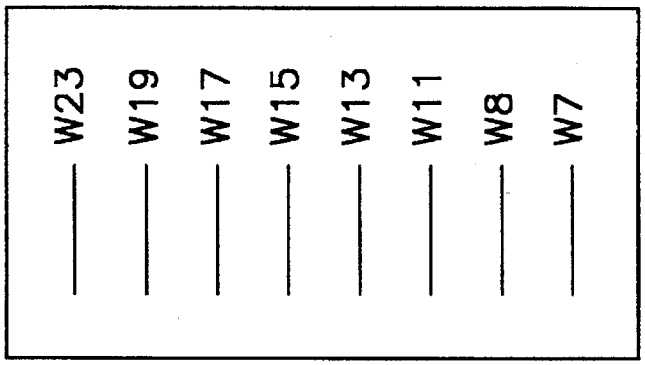
Figure 4B:
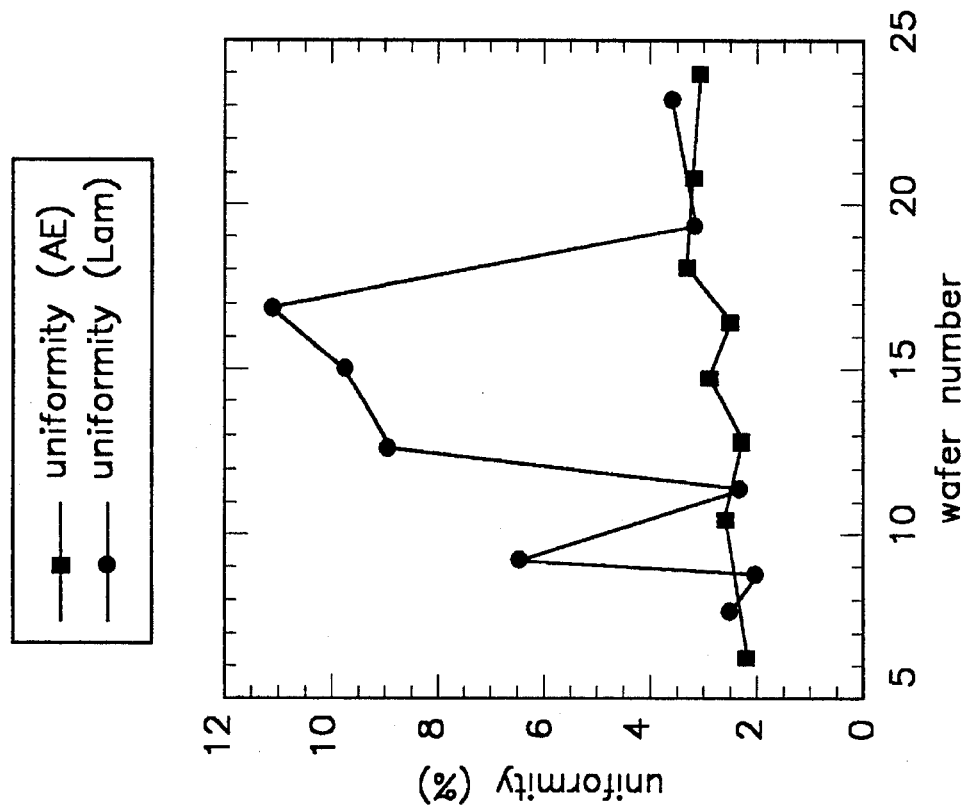
FIGS. 4A and 4B are graphs of the etch rates and uniformity percentage for both static and dynamic power control systems.
Figure 4A:
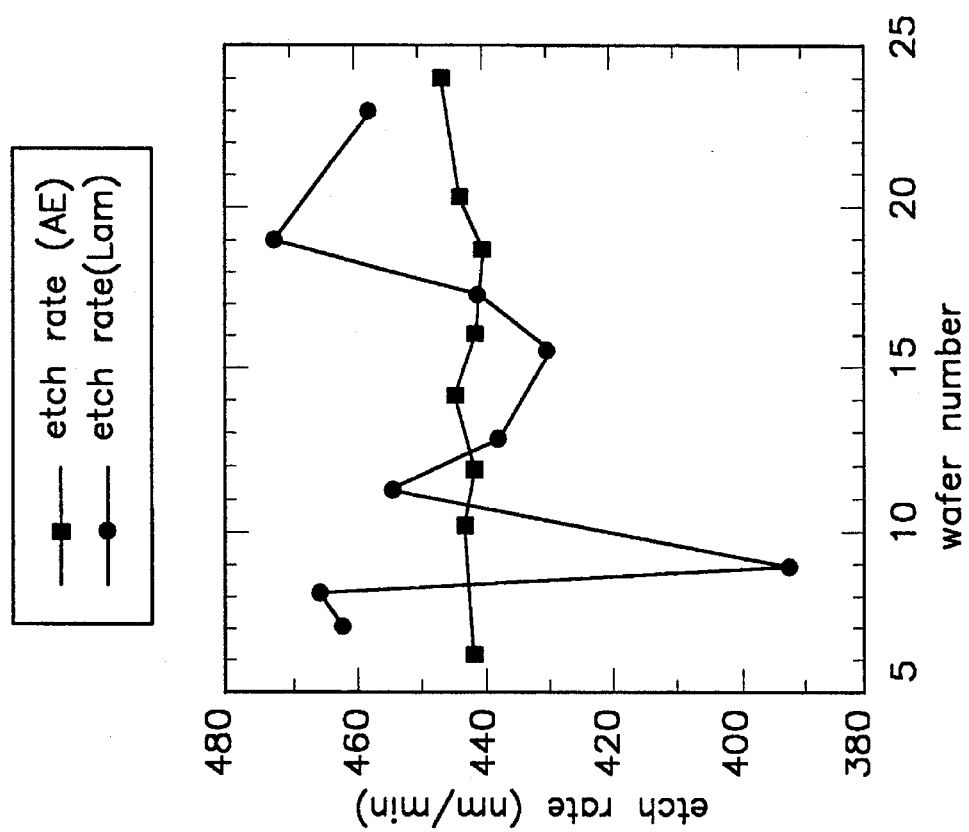
Figure 5B:
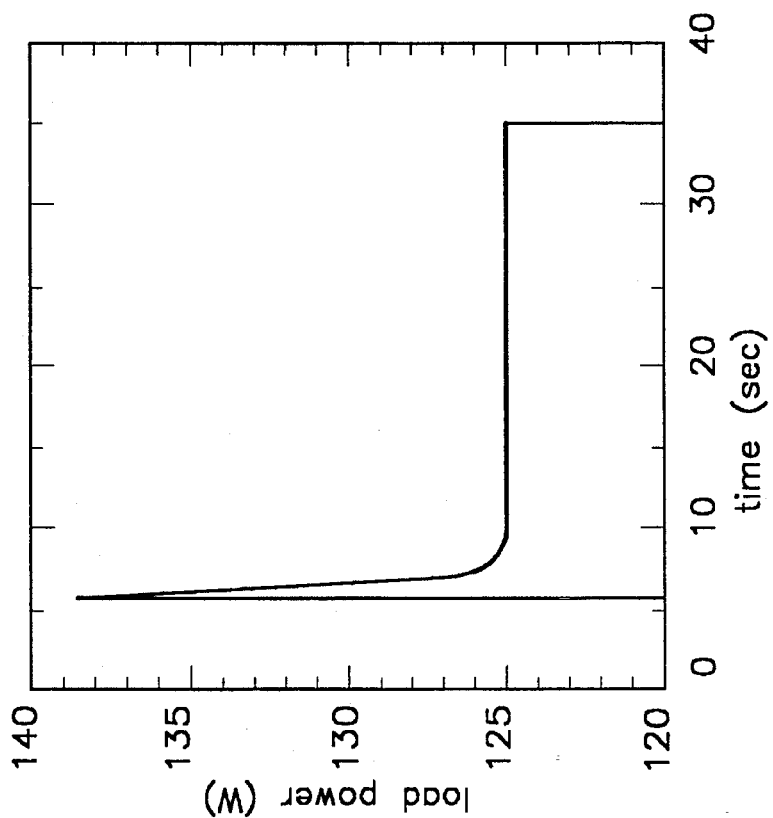
FIGS. 5A and 5B are graphs of dynamic load power control of the present invention.
Figure 5A:
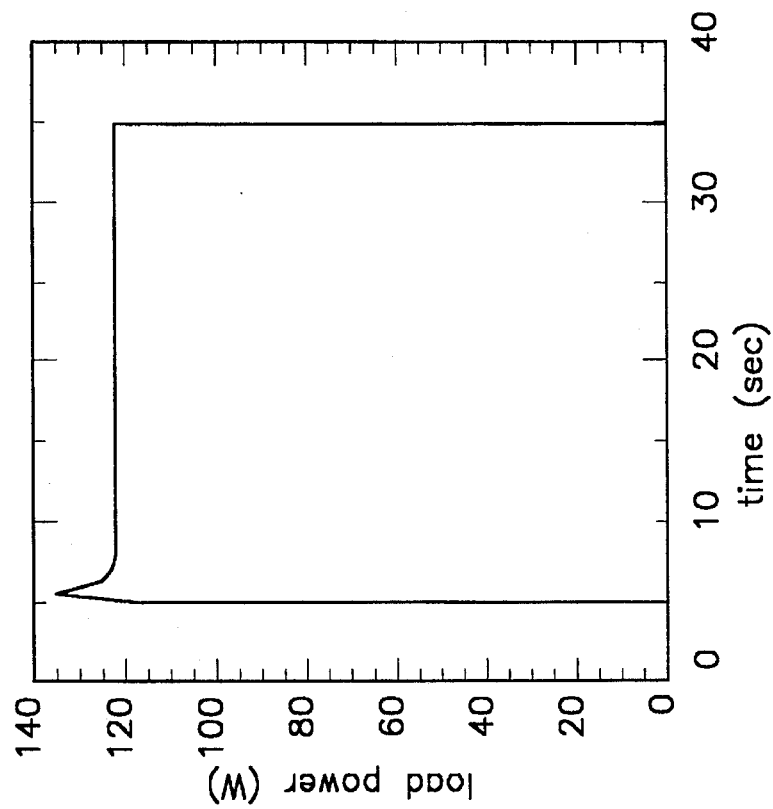

Referring now to FIG. 2B, a schematic block diagram of another preferred embodiment of the present invention for a system for plasma etching a semiconductor wafer is illustrated schematically. The output of RF generator 102 is connected to a radio frequency circulator 302. One output port 302a of the circulator 302 connects to the plasma chamber 104 through the power sensor 202. A termination resistor 304 connects to another port 302b of circulator 302. A termination resistor 304 absorbs substantially all of the reflected power caused by a high standing wave ratio ("SWR") and harmonics from the plasma chamber 104 reactive and non-linear impedance.

The purpose of circulator 302 is to present a more uniform load 302c to the RF generator 102 without the need of an adjustable matching network 120 (FIG. 2A). Power to the plasma chamber 104 is monitored by power sensor 202 and closely controlled by means of the computer system RF power generator controller 204 which controls the output of the RF generator 102.

Power from the generator 102 to the plasma chamber 104 is precisely controlled by the controller 204 without introducing unknown power losses caused by varying transfer efficiencies of the matching network 120 or circulator 302 when used over the range of impedance values presented during the plasma process.

The computer system and radio frequency power generator controller 204 may be controlled by a computer and software program that dynamically determines the power delivered to the chamber 104 at any instant of time during the plasma etching process. Control profiles for each type of process gas and type of work piece may be stored in the software program. A plurality of different processes may be characterized and stored for subsequent commercial manufacturing of semiconductor wafers.

An advantage in knowing the voltage, current, phase angle and impedance parameters of the plasma chamber enables better control of the plasma process parameters. These parameters may also be used to characterize any abnormality or deviation from a normally expected etching process. A chamber leak will result in a variance from the characteristic parameters as will contamination of the chamber. Once a desired process is characterized, all of the chamber parameters may be monitored to insure that each subsequent process is substantially uniform with the one before.

Figure 6:
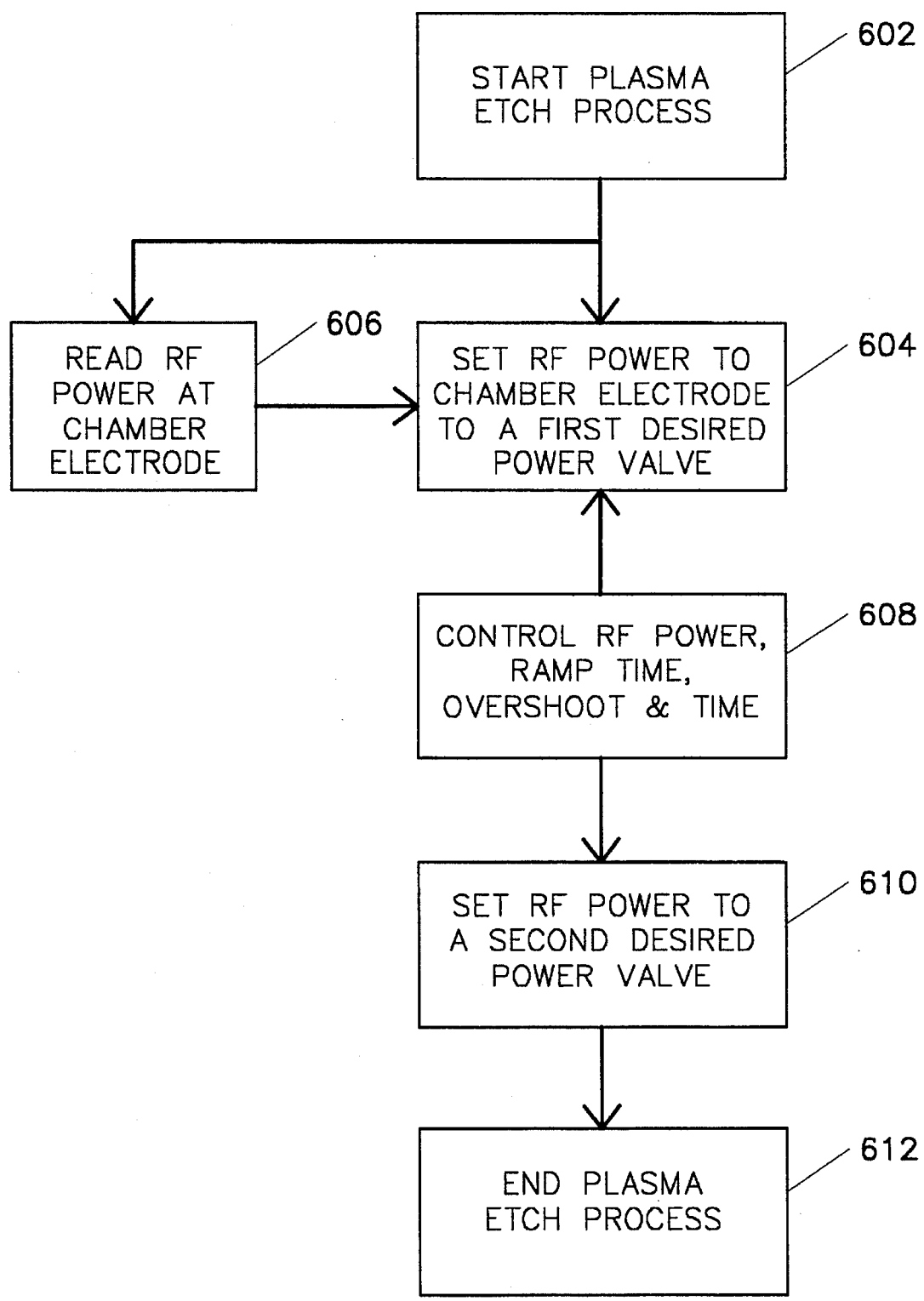
FIG. 6 is a schematic block flow diagram of the computer program of the present invention.

Referring now to FIG. 6, a schematic block diagram of a software program of the present invention is illustrated. Step 602 starts the plasma process and step 604 causes the computer system 204 to dynamically set the radio frequency power at the chamber electrode (112, 114) to a first desired power value as determined by the RF parameter sensor 202 in step 606. The program of step 608, controls the dynamic characteristics of the RF power profile to the chamber 104 so as to maximize the consistency and repeatability of the plasma characteristics for each subsequent process.

The program of step 608 controls the ramp time, overshoot and time duration of the first desired power value applied to the chamber 104. Dynamically controlling the first desired power value substantially increases the uniformity of the plasma at the beginning of the process where uniformity is especially critical. The program of step 608 causes step 610 to set the RF power to a second desired power value after a predetermined time. This second desired power value may then be utilized during the remainder of the plasma etching process. One skilled in the art will recognize that a plurality of desired power values and times may be utilized during an etching process. Step 612 ends the process when a desired etch time is completed.

The present invention, therefore, is well adapted to carry out the objects and attain the ends and advantages mentioned, as well as others inherent therein. While presently preferred embodiments of the invention and various aspects thereto have been given for purposes of disclosure, numerous changes in the details of construction, interconnection and arrangement of parts will readily suggest themselves to those skilled in the art, and which are encompassed within the spirit of the invention and the scope of the appended claims.

What is claimed is:

1. A plasma processing system, comprising:
   a radio frequency power generator having a radio frequency power output;
   a plasma chamber having a radio frequency electrode;
   a radio frequency parameter sensor having a radio frequency input connected to said radio frequency power generator and a radio frequency output connected to said plasma chamber electrode, said parameter sensor having a signal output representative of the radio frequency power at said plasma chamber electrode; and
   a controller connected to said sensor signal output, wherein said controller controls said radio frequency power generator output so that an initial first desired power value is applied to said electrode for a first amount of time and a second desired power value is applied to said electrode for a second amount of time after the first amount of time has elapsed.

2. The plasma processing system of claim 1, further comprising a radio frequency matching network connected between said power generator output and said parameter sensor radio frequency input.

3. The plasma processing system of claim 1, further comprising a radio frequency circulator connected between said power generator output and said parameter sensor radio frequency input.

4. The plasma processing system of claim 3, wherein said radio frequency circulator has first, second and third ports, wherein the first port is connected to said radio frequency power generator output and the second port is connected to said parameter sensor radio frequency input; and a termination resistor is connected to said circulator third port, said resistor dissipating reflected power and harmonics from the plasma chamber electrode.

5. The plasma processing system of claim 1, further comprising said parameter sensor measuring the power, voltage, current, phase angle and impedance parameters at said plasma chamber electrode.

6. The plasma processing system of claim 5, wherein said controller dynamically controls the power, voltage, current, phase angle and impedance parameters of said plasma chamber electrode.

7. The plasma processing system of claim 1, further comprising said parameter sensor measuring the voltage on said plasma chamber electrode and said controller limiting the maximum voltage on the electrode by controlling said power generator output.

8. The plasma processing system of claim 1, further comprising said parameter sensor measuring the current through said plasma chamber electrode and said controller limiting the maximum current through the electrode by controlling said power generator output.

9. The plasma processing system of claim 1, wherein said controller is a software program controlled computer system.

10. The plasma processing system of claim 1, wherein said controller is selectively programmable to control a desired process power profile depending on the selected process gas and work piece.

11. The plasma processing system of claim 1, wherein said controller controls the ramp time and overshoot of the radio frequency power from said radio frequency power generator output.

12. The plasma processing system of claim 1, further comprising said controller controlling the plasma gas flow.

13. The plasma processing system of claim 1, further comprising said controller controlling the plasma gas pressure.

14. The plasma processing system of claim 1, further comprising a parameter variance detector connected to said parameter sensor, said parameter variance detector detecting variations in an expected plasma process profile.

15. The plasma processing system of claim 14, further comprising a parameter variance alarm connected to said parameter variance detector for alarming on selected variations in an expected plasma process profile.

16. The plasma processing system of claim 14, wherein said parameter variance detector is characterized to detect a gas leak in said plasma chamber.

17. The plasma processing system of claim 14, wherein said parameter variance detector is characterized to detect contamination in said plasma chamber.

18. The plasma processing system of claim 1, wherein said controller controls a plurality of desired power values and associated times.

19. A method for measuring and controlling process parameters in a plasma processing system, said method comprising the steps of:

monitoring a plurality of radio frequency parameters of a plasma chamber electrode with a parameter sensor connected at the electrode;

dynamically controlling a radio frequency power generator so as to maintain desired parameter values at the plasma chamber electrode during a plasma process.

20. The method of claim 19, wherein the step of dynamically controlling the radio frequency power generator comprises the steps of maintaining a first desired power value for a first amount of time and maintaining a second desired power value for a second amount of time after the first amount of time has elapsed.

21. The method of claim 19, further comprising the step of dynamically controlling the voltage at the plasma chamber electrode.

22. The method of claim 19, further comprising the step of dynamically controlling the current at the plasma chamber electrode.

23. The method of claim 19, further comprising the step of dynamically controlling the phase angle at the plasma chamber electrode.

24. The method of claim 21, further comprising the step of controlling the maximum voltage at the plasma chamber electrode.

25. The method of claim 21, further comprising the step of controlling the maximum current at the plasma chamber electrode.

26. The method of claim 19, further comprising the step of detecting at least one process parameter variation from an expected plasma process parameter profile.

27. The method of claim 26, further comprising the step of alarming when the at least one process parameter varies from an expected plasma process parameter profile.

28. The method of claim 19, further comprising the step of detecting a gas leak in a plasma chamber when monitoring the process parameters by detecting a variation from an expected plasma process parameter profile.

29. The method of claim 19, further comprising the step of detecting contamination in a plasma chamber when monitoring the process parameters by detecting a variation from an expected plasma process parameter profile.

30. The method of claim 19, wherein the step of controlling a radio frequency power generator comprises controlling a plurality of desired power values and associated times at the electrode.

* * * * *